United States Patent
Warmerdam et al.

(10) Patent No.: US 7,571,793 B2
(45) Date of Patent: Aug. 11, 2009

(54) ACTUATOR ARRANGEMENT FOR ACTIVE VIBRATION ISOLATION USING A PAYLOAD AS AN INERTIAL REFERENCE MASS

(75) Inventors: Thomas Petrus Hendricus Warmerdam, Eindhoven (NL); Michael Johannes Vervoordeldonk, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 449 days.

(21) Appl. No.: 10/597,317

(22) PCT Filed: Jan. 14, 2005

(86) PCT No.: PCT/IB2005/050160

§ 371 (c)(1),
(2), (4) Date: Jul. 20, 2006

(87) PCT Pub. No.: WO2005/073592

PCT Pub. Date: Aug. 11, 2005

(65) Prior Publication Data

US 2008/0237947 A1    Oct. 2, 2008

(30) Foreign Application Priority Data

Jan. 26, 2004    (EP)    .................... 04100271

(51) Int. Cl.
*F16F 7/10*    (2006.01)
(52) U.S. Cl. ...................... 188/378; 267/136
(58) Field of Classification Search ............... 248/550, 248/562; 267/136; 188/378–379
See application file for complete search history.

(56) References Cited

U.S. PATENT DOCUMENTS

| | | | | |
|---|---|---|---|---|
| 4,796,873 A | * | 1/1989 | Schubert | ................. 267/136 |
| 5,390,891 A | * | 2/1995 | Hornung et al. | ............ 248/581 |
| 5,823,307 A | * | 10/1998 | Schubert et al. | ............ 188/378 |
| 6,193,206 B1 | * | 2/2001 | Yasuda et al. | ............... 248/550 |
| 6,378,672 B1 | * | 4/2002 | Wakui | ........................ 188/378 |
| 6,942,202 B2 | * | 9/2005 | Kienholz | ............... 267/140.14 |

* cited by examiner

*Primary Examiner*—Christopher P Schwartz

(57) ABSTRACT

System for and method of active vibration isolation to isolate a payload (57) from earth movements. The system has a body (16; 51), a mass (41) supported by the body (51) by means of at least one spring (45), a further mass (39) supported by the mass (41) by means of at least one further spring (43). A sensor senses a distance between the mass (41) and the further mass (39) and generates a distance signal. A controller (49) receives the distance signal and generates a control signal based on the distance signal. An actuator (47) actuates a position of said mass (41) based on the control signal, whereas the further mass supports the payload to be isolated from earth (16).

9 Claims, 4 Drawing Sheets

ACTUATOR ARRANGEMENT FOR ACTIVE VIBRATION ISOLATION USING A PAYLOAD AS AN INERTIAL REFERENCE MASS

The invention relates to an actuator arrangement for active vibration isolation, comprising an inertial reference mass.

FIG. 1 shows an active vibration isolation system according to the prior art. The system comprises a payload 2 which, e.g., may be a metroframe in a lithography machine. A velocity sensor 4 is attached to the payload 2. Instead of a velocity sensor, an acceleration sensor may be used. The sensor 4 may be a geophone.

The sensor 4 is connected to a controller 6, sometimes referred to as "sky hook" controller. The controller 6 may be any suitable programmed (micro)computer.

However, analog and digital circuits may be used where appropriate.

An actuator 8 is provided between the payload 2 and "ground" 16. The controller 6 is connected to the actuator 8 to provide the actuator 8 with a suitable input signal. In practice, an amplifier (not shown) is located between the controller 6 and the actuator 8 to generate a power signal to be sent to actuator 8 based on the controller output signal. It is observed that the connections between the sensor 4, the controller 6 and the actuator 8 are shown as physical lines. However, as known to a person skilled in the art, these connections may be wireless connections. This observation also holds for other connections shown in embodiments of the present invention.

The actuator 8 is shown in a schematic way. The actuator 8 may be a Lorentz motor or any other suitable actuator arranged to generate forces as controlled by controller 6.

FIG. 1 also shows an airmount 10 comprising a piston 12 and a housing 14 in which the piston 12 can move up and down. In use, the housing 14 is filled with air (or any other suitable gas). A valve 20 is provided that is connected to the housing 14 by means of a channel 21. A controller is connected to the valve 20 to control its operation. A sensor 18 is provided to measure the distance $z1$ between the housing 14 of the airmount 10 and the payload 2. The sensor 18 is connected to a comparator 17, which also receives a reference signal $z1ref$. The sensor 18 generates an output signal indicative of the distance $z1$. The comparator 17 generates an output signal that is proportional to the difference between $z1ref$ and the output of sensor 18 and applies this to the controller 19. The controller 19 actuates the valve 20 in such a way that the distance $z1$ is controlled at the desired level $z1ref$.

The controllers 6 and 19 need not be separate physical units. They may be implemented as separate programs running on the same computer.

In practice, the payload 2 may be very heavy, e.g. 3000 kilograms or more. It is not strictly necessary that the airmount 10 is provided as an actively controlled arrangement. It may, alternatively, be a passive vibration isolation arrangement. Instead of an airmount 10, other vibration isolation arrangements such as a spring, may be used.

In practical situations, as will be evident to a person skilled in the art, there will mostly be three or four airmounts 10 to support the payload 2. Moreover, FIG. 1 shows one actuator arrangement, including the sensor 4, the controller 6 and the actuator 8; however, in practice there may be multiple actuator arrangements. The actuator arrangements are then arranged to provide vibration isolation in any of six degrees of freedom (x, y, z and rotations about x, y and z), or combinations of the different degrees of freedom.

The sensor 4 may be a geophone that, as known to persons skilled in the art, comprises a reference mass, or inertial mass, against which displacement of mass 2 is measured.

FIG. 2 shows another example of a prior art active vibration isolation system, as disclosed by P. G. Nelson, *An active vibration isolation system for inertial reference and precision measurement*, Rev. Sci. Instr. 62(9), September 1991, pp. 2069-2075. FIG. 2 shows a ceiling 23 that can be conceived to be "earth". The ceiling 23 is at height $zc$. A mass 27 is suspended from the ceiling 23 by a spring 35. An actuator 25 is located between the ceiling 23 and the mass 27 to control a height $z2$ at which mass 27 is located.

A mass 29 suspends from the mass 27 by a spring 37. The mass 29 is at a height $z3$. A sensor 33 senses a distance d between masses 27 and 29. The sensor may be a capacitive sensor. The distance d is a measure of the difference between heights $z2$ and $z3$: $z2-z3$. The sensor 33 generates a feedback signal to a controller 31 that, based upon this feedback signal, generates a control signal for the actuator 25.

In the prior art the system as shown in FIG. 2 is used follows: sensor 33, spring 37, and mass 29 together form a seismometer where mass 29 is a reference mass, or inertial mass of the seismometer. It is shown that by feeding back the distance signal d to the controller 31, the transmissibility of $z2/zc$ is improved. So this document discloses that dependency of movement of a mass suspended from "earth" on the movement of the earth can be reduced by feeding back a distance signal relating to a distance between this mass and another, inertial reference mass.

In none of the prior art documents, the inertial mass has another purpose than being a reference mass against which displacement of a mass to be controlled is measured. The object of the present invention is to provide an active vibration isolation system that improves the vibration isolation of a payload in view of both prior art documents.

To achieve this object, the present invention provides an active vibration isolation system arranged to isolate a payload from earth movements, the payload being supported by means of at least one spring, the system comprising a sensor for sensing a displacement of the payload and generating a displacement signal, a controller for receiving the displacement signal and generating a control signal based on the displacement signal, and an actuator arranged to generate an actuation force based on the control signal, characterized in that the system comprises a mass supporting the payload, the sensor is arranged to sense a displacement of the payload relative to the mass, and the actuator is arranged to apply the actuating force to the mass, such that the payload is used as an inertial reference mass.

Thus, the invention is based on the insight that the payload whose vibrations need to be controlled can be used as a reference mass, or inertial mass, on which all kinds of different industrial processes can be performed. It can be shown that by the arrangement according to the invention, the payload is better isolated from earth movements than in both prior art arrangements as shown in FIGS. 1 and 2. Especially at lower frequencies, displacement measurements outperform velocity measurements and provide better active isolation. Moreover, no actuator is needed to control movements of the payload directly.

The invention also relates to a lithography apparatus provided with an active vibration isolation system as defined above. However, the invention can equally well be applied in any other high-precision machine.

The invention also relates to a method of active vibration isolation to isolate a payload from earth movements, comprising:

supporting the payload by means of at least one spring, providing a sensor for sensing a displacement of the payload and generating a displacement signal, generating a control signal based on the displacement signal, generating an actuation force based on the control signal, characterized by supporting the payload by a mass, sensing a displacement of the payload relative to the mass, applying the actuating force on the mass, such that the payload is used as an inertial reference mass.

Below, the invention will be illustrated in detail with reference to some drawings. These drawings are only intended to clarify the present invention and show some embodiments only. They are not intended to limit the invention in any way. The present invention is only limited by the annexed claims and its technical equivalents.

Figure 1:
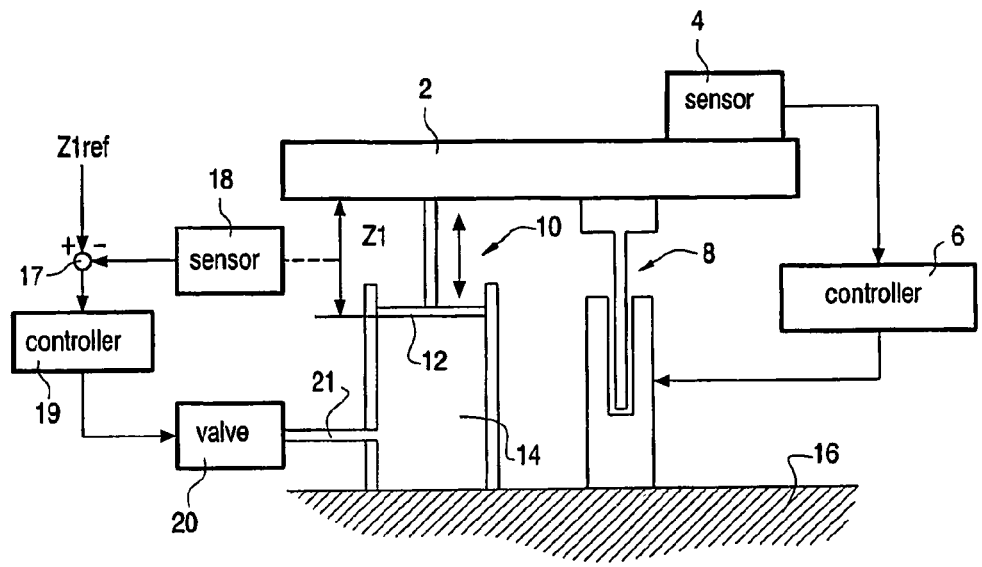
FIG. 1 shows an active vibration isolation system according to the prior art.
Figure 2:
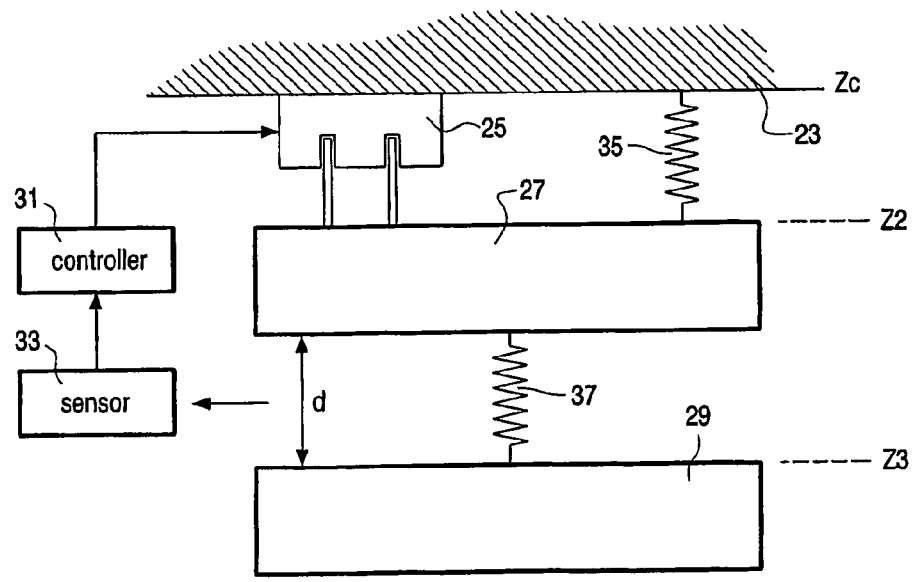
FIG. 2 shows another active vibration isolation system according to the prior art.

FIGS. 1 and 2 have been explained above.

Figure 3:
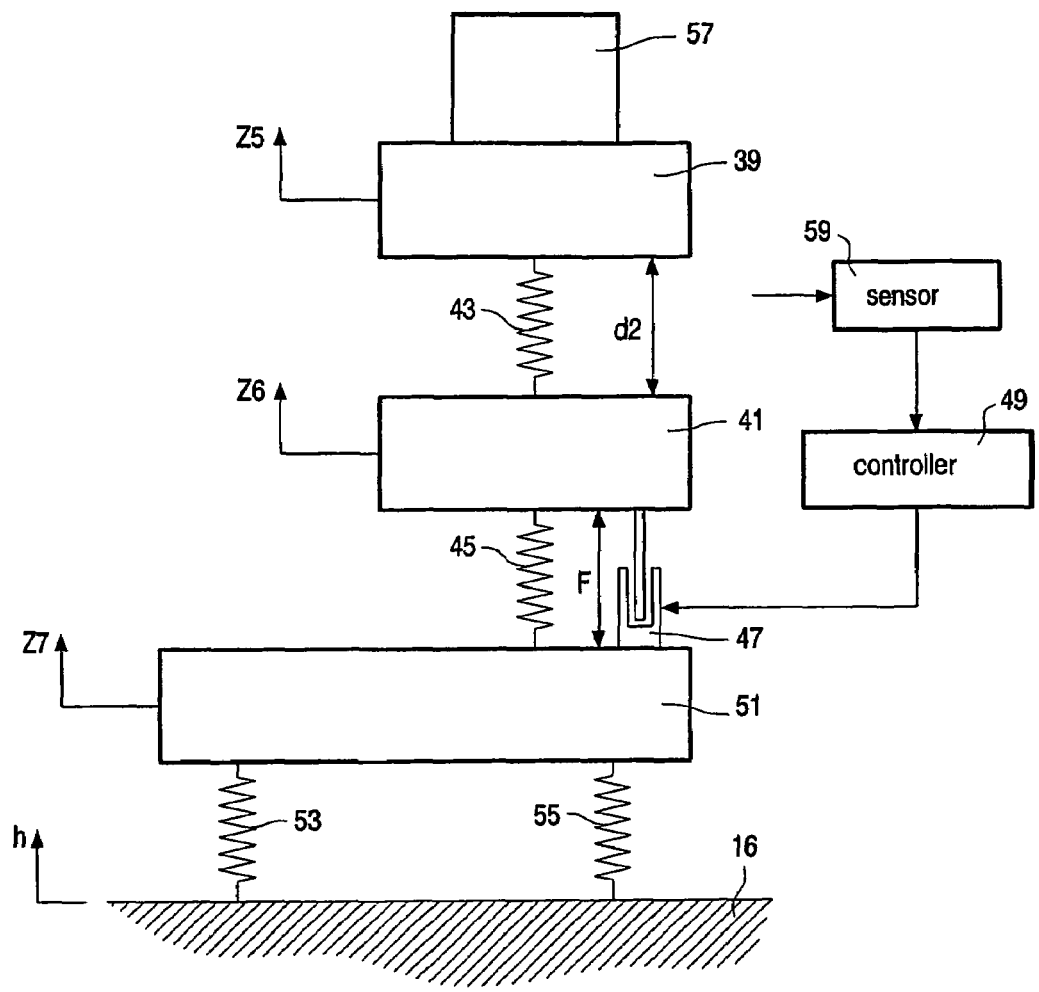
FIG. 3 shows an active vibration isolation system according to the invention.

FIG. 3 shows a first mass 51 supported by the earth 16 by supporting devices, like legs. Since these supporting devices will have a limited stiffness, they are shown as springs 53, 55. Although two supporting devices 53, 55 are shown, in practice there may be three or may be more supporting devices. A second mass 41 is supported by the first mass 51 by means of a spring 45. Again, in practice there may or will be more springs between the first and the second mass. A third mass 39 is supported by the second mass 41 by means of a spring 43. Again, there may be more than one spring between the third mass 39 and the second mass 41. The third mass 39 is a payload. In use, the payload 39 supports one or more devices 57 used in one or more industrial processes. The first mass 51 need not be present. Then, second mass 41 is supported directly by earth 16.

This setup of three different masses 39, 41, 51, can e.g. be used in lithographic equipment. In a lithographic apparatus, the first mass 51 may be a base frame with a mass of 2000 kg, the second mass 41 may be a sub-frame with a mass of 4000 kg, whereas the third mass 39 may be a metroframe with a mass of 3200 kg. In such a lithographic apparatus, the springs 43, 45 will have different spring constants. E.g., the spring 43 may be selected such that it provides the third mass 39 with an eigenfrequency in the range from 0.1-10 Hz, e.g., 0.3 Hz. The spring 45 may be arranged such that it provides the second mass 41 with an eigenfrequency in the range from 1-10 Hz, e.g., 3 Hz. The supporting devices 53, 55 may be such that they provide the first mass 51 with an eigenfrequency in the range from 30-40 Hz, e.g., 35 Hz, or higher.

In a lithographic apparatus, the metroframe 39 supports devices 57 that may include accelerometers, projection lenses and one or more sensors.

The first mass 51 is shown to have a displacement z7, the second mass 41 is shown to have a displacement z6, whereas the third mass 39 is shown to have a displacement z5. Earth 16 is shown to have a displacement h. A sensor 59 is provided to measure a change of a distance d2, i.e., a displacement between the second mass 41 and the third mass 39. This change of distance d2 is a measure of the difference between z5 and z6: that is z5−z6. The sensor 59 generates an output signal that is an indication of the change of distance d2. This output signal is transmitted to a controller 49. The controller 49 generates a control signal based on this output signal of sensor 59. The control signal is transmitted to an actuator 47. The actuator 47 actuates the second mass 41. This actuator 47 may be a Lorenz motor or any other suitable actuator arranged to generate forces F as actuated by controller 49. In the arrangement as shown in FIG. 3, the payload 39 itself functions as an inertial reference mass.

Figure 4:
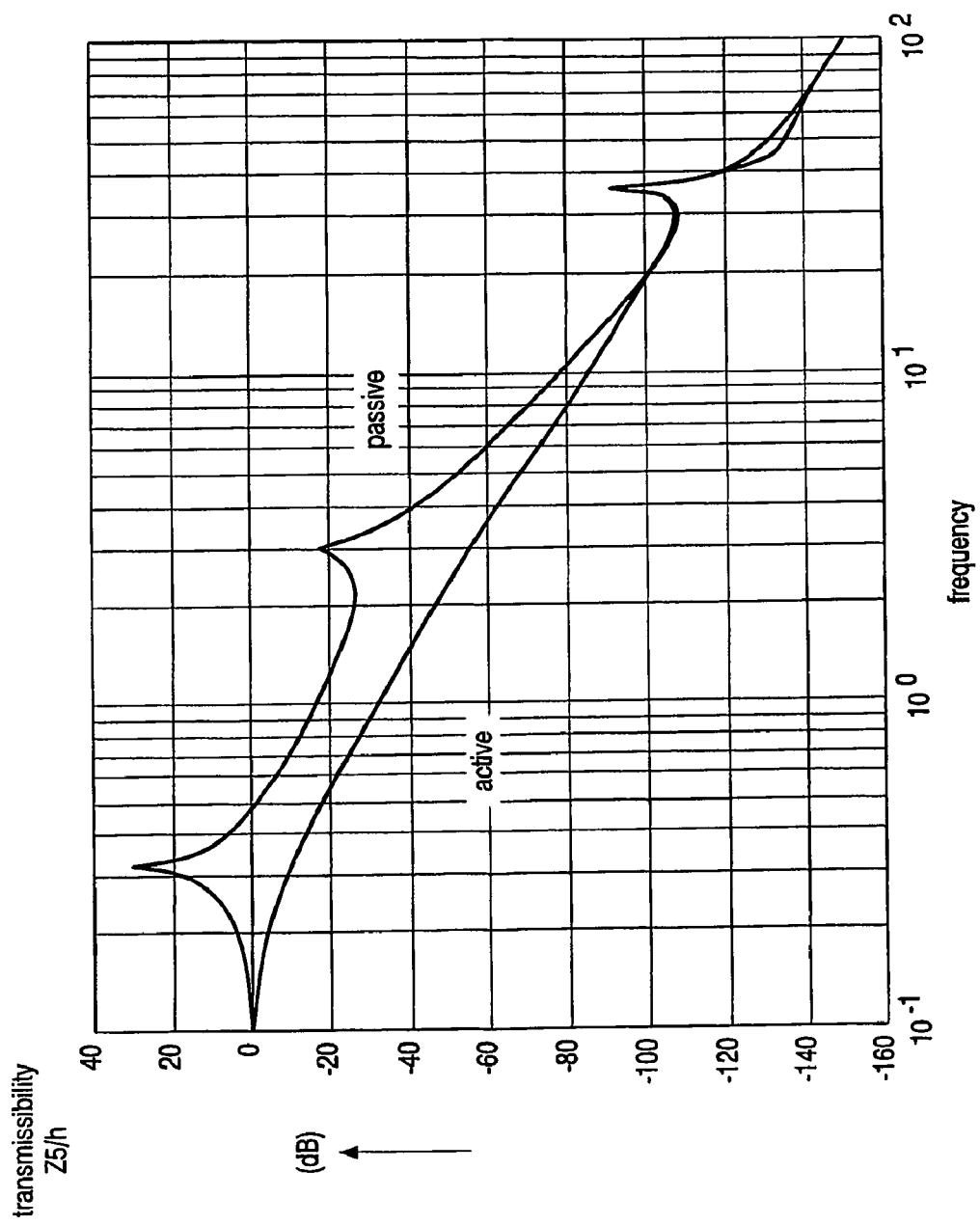
FIG. 4 shows an example of a transmissibility of the system according to FIG. 3.

Using the change of distance d2 as an input to the controller 49 turns out to provide a very good active isolation of the payload 39 supporting devices 57. This is shown in FIG. 4. FIG. 4 shows the transmissibility of z5/h, both in a passive mode and an active mode. In the passive mode, the controller 49 is turned off, whereas in the active mode the controller 49 is turned on. FIG. 4 shows that, in the active mode, the transmissibility z5/h is much better. That is, the dependency of movements of the payload 39 on the earth 16 is reduced. This reduction already starts with very low frequencies in the design of FIG. 3 when the springs 43, 45 have eigenfrequencies as indicated above. These eigenfrequencies of 0.3 Hz for spring 43, 3 Hz for spring 45, and 35 Hz for supporting devices 53, 55 can be recognized in the passive mode transmissibility z5/h in FIG. 4.

As indicated above, for the application of the present invention it is not strictly necessary that there is a first mass 51 which is supported by the earth 16 by means of supporting devices 53, 55. Instead, the second mass 41 can be directly supported by the earth 16 by means of the spring 45 and as controlled by actuator 47.

The springs 43, 45 can be any suitable spring as desired. They may be passive springs. They may also be airmounts as shown in the prior art according to FIG. 1.

Figure 5:
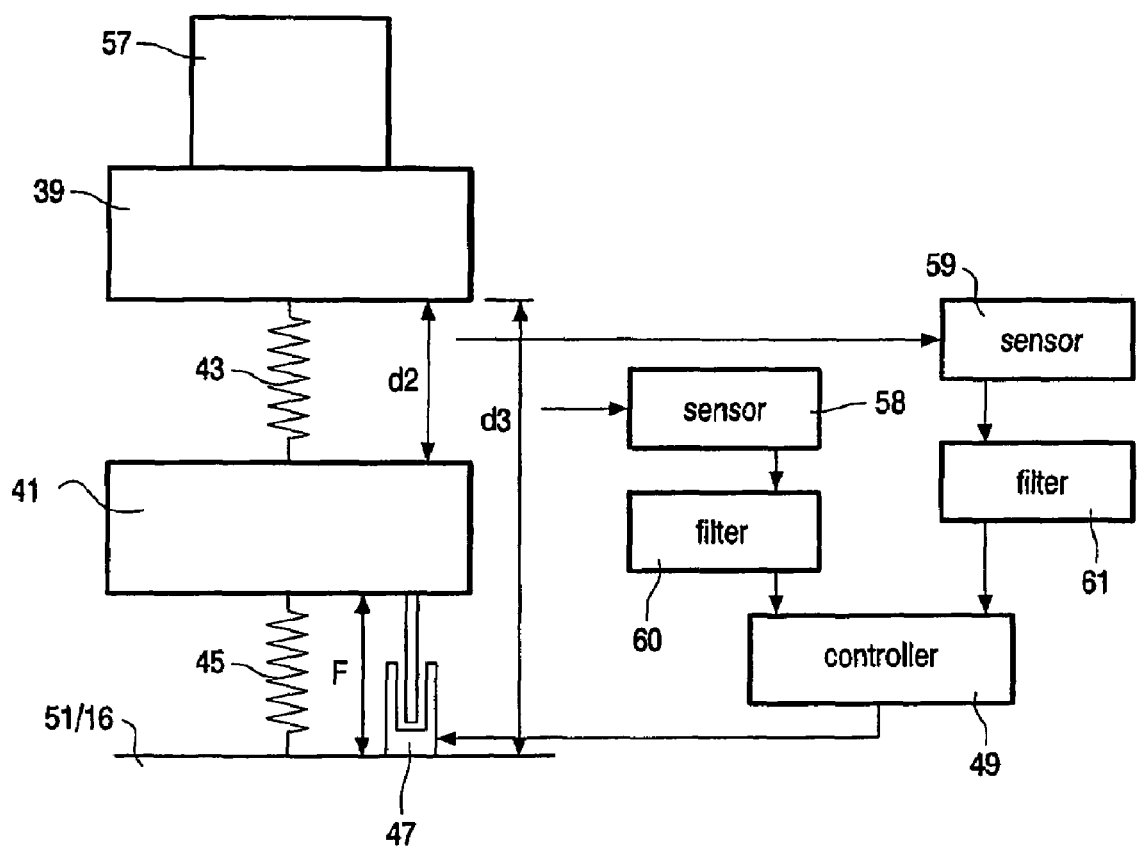
FIG. 5 shows an alternative embodiment of the invention.

FIG. 5 shows an alternative embodiment of the present invention. Like reference signs refer to like components of earlier Figures. Differences from the embodiment according to FIG. 3 are as follows. The arrangement comprises a first filter 61 between the sensor 59 and the controller 49. Moreover, a further sensor 58 is provided to sense the distance d3 between payload 39 and either first mass 51 or earth 16. The sensor 58 is connected to the controller 49 via a second filter 60.

Thus, in the arrangement according to FIG. 5, output signals of the sensors 58, 59 are weighted by filter coefficients of the respective filters 60, 61, and controller 49 receives a weighted sum of signals related to d2 and d3. In an embodiment, the filters 60, 61 are designed to provide the feedback influence of d2 with higher weight for higher frequencies and the feedback influence of d3 with higher weight for lower frequencies.

The filters 60, 61 may be combined with the controller 49 in one unit, as will be evident to persons skilled in the art.

The invention claimed is:

1. Active vibration isolation system arranged to isolate a payload (39) from earth movements, said payload (39) being supported by means of at least one spring (43) and used as an inertial reference mass, said system comprising:

a mass (41) supporting said payload (39) by means of said at least one spring (43) and being supported by a base body (16; 51) via a further spring (45);

a sensor (59) for sensing a displacement of said payload (39) relative to said mass (41) and generating a displacement signal, wherein the displacement signal is an indication of the change of distance (d2) between the payload (39) and said mass (41);

a controller (49) for receiving said displacement signal and generating a control signal based on said displacement signal; and an actuator (47) arranged in parallel with the further spring (45) between said mass (41) and said body (16; 51), said actuator (47) for generating an actuation force based on said control signal and applying said actuating force to said mass (41).

2. Active vibration isolation system according to claim 1, wherein said payload (39) supports one or more devices (57).

3. Active vibration isolation system according to claim 1, wherein said body is earth (16).

4. Active vibration isolation system according to claim 1, wherein said body is a base frame (51) supported by earth (16) by means of at least one supporting device (53, 55).

5. Active vibration isolation system according to claim 1, wherein said further spring (45) is arranged to provide said mass (41) with an eigenfrequency in the range from 1-10 Hz.

6. Active vibration isolation system according to claim 1, wherein said spring (43) is arranged to provide said payload (39) with an eigenfrequency in the range from 0.1-10 Hz.

7. Lithography apparatus provided with an active vibration isolation system according to claim 1.

8. Method of active vibration isolation to isolate a payload (39) from earth movements, comprising:

supporting said payload (39) by a mass (41) via at least one spring (43), said payload (39) being used as an inertial reference mass, providing a sensor for sensing a displacement of said payload (39) relative to said mass (41) and generating a displacement signal, said displacement signal being an indication of the change of distance (d2) between said payload (39) and said mass (41), generating a control signal based on said displacement signal, generating an actuation force via an actuator (47) based on said control signal, and applying said actuating force on said mass (41), wherein said mass (41) is supported by a base body (16; 51) via a further spring (45) between said mass (41) and said body (16; 51), and said actuator (47) is arranged between said mass (41) and said base body (16; 51) in parallel with the further spring (45).

9. Method according to claim 8, further comprising:

supporting one or more devices (57) by said payload (39), and using said one or more devices (57) in an industrial process.

* * * * *